United States Patent
Takahashi

(10) Patent No.: US 7,570,126 B2
(45) Date of Patent: Aug. 4, 2009

(54) TUNING-FORK TYPE PIEZOELECTRIC VIBRATING PIECE AND OSCILLATOR

(75) Inventor: Takehiro Takahashi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 115 days.

(21) Appl. No.: 11/868,288

(22) Filed: Oct. 5, 2007

(65) Prior Publication Data

US 2008/0084251 A1    Apr. 10, 2008

(30) Foreign Application Priority Data

Oct. 6, 2006    (JP) .............................. 2006-275193

(51) Int. Cl.
*H01L 41/047* (2006.01)
*H03B 5/32* (2006.01)

(52) U.S. Cl. ...................... 331/163; 310/318; 310/368; 310/370

(58) Field of Classification Search ............. 331/116 R, 331/116 FE, 158, 159, 163; 310/311, 314, 310/318, 365–367, 370

See application file for complete search history.

(56) References Cited

U.S. PATENT DOCUMENTS 4,384,232 A * 5/1983 Debely ....................... 310/370

FOREIGN PATENT DOCUMENTS

| JP | 1999-160074 | 6/1999 |
| JP | 2002-076827 | 3/2002 |
| JP | 2005-229143 | 8/2005 |

* cited by examiner

*Primary Examiner*—David Mis

(57) ABSTRACT

A tuning fork type piezoelectric vibrating piece, comprising: a base unit having a base electrode for an external connection; a fork shaped arm unit extending from the base unit; a groove portion at least on a surface or a rear surface of the arm unit; a groove electrode on the groove portion; a side surface electrode on the arm unit without the groove portion; a first electrode connecting the base unit and the side surface electrode or the groove electrode; a second electrode connecting the groove electrode and the side surface electrode; and a side surface electrode set at a predetermined distance from the bottom of the fork part of the base unit. The piezoelectric vibrating piece may be packaged with a base electrode connected to an external output terminal. The piezoelectric oscillator may have an amplifier circuit and a feedback circuit with a resonant element determining the resonant frequency.

7 Claims, 7 Drawing Sheets

(a)

(b)

TUNING-FORK TYPE PIEZOELECTRIC VIBRATING PIECE AND OSCILLATOR

CROSS-REFERENCE TO RELATED PATENT APPLICATION

This application claims the benefit of Japanese Patent Application No. 2006-275193 filed on Oct. 6, 2006 in the Japan Patent Office, the disclosure of which is incorporated herein in its entirety by reference.

FIELD OF THE INVENTION

This invention is, for example, related to a tuning-fork type piezoelectric vibrating piece used with a crystal oscillator, a piezoelectric vibrating device used with an appropriate oscillator, and a piezoelectric oscillator used with an appropriate piezoelectric vibrating device.

BACKGROUND

Piezoelectricity has been used a number of useful applications. For example, crystal piezoelectric devices may be used for electronic frequency generation. With the increasing demand for miniaturization or weight savings in electronic devices, the tuning fork type crystal unit is becoming widely used. By forming the crystal unit to a tuning fork shape, the unit may produce low Crystal Impedance (CI) values. The CI value is equivalent to the inline resistance value of a crystal oscillator.

The structure of a typical tuning-fork type crystal unit is illustrated in FIGS. 6 (*a*) and (*b*). FIG. 6 (*a*) is a perspective view of a tuning-fork type crystal piece 100 and FIG. 6(*b*) is a cross-sectional view taken from line A-A' of FIG. 6(*a*). It should be noted that indications of excitations for electrodes on the surfaces of the tuning-fork type crystal unit are omitted for convenience.

As showed in FIG. 6(*a*), the tuning-fork type crystal piece 100 is comprised of a base unit 103 and arm units 101 and 102 extended from the base unit in a tuning-fork shape. On the surface and rear surface of the arm units 101 and 102, groove portions 101*a* and 102*a* are formed on the both surfaces in a longitudinal direction. Therefore, the cross-sectional view of the arm units 101 and 102 are substantially H-shaped as shown in FIG. 6(*b*). In contrast to flat-shaped crystal units, such a tuning-fork type crystal unit having two arm portions with a substantially H-shaped cross-section may raise the electromechanical conversion coefficient even when the crystal vibrating piece is downsized, thus allowing for the unit to maintain a low CI value.

In order to vibrate the tuning-fork type crystal piece 100 at a desired frequency, an excitation electric field may be applied to the arm units 101 and 102. For this purpose, grooved electrodes may be formed in a longitudinal direction in the grooved portions 101*a* and 102*a*, as well as on the side parts 101*b* and 102*b* having no grooved portion. Each grooved electrode in the side portions is also formed in the longitudinal direction.

In order to form an excitation electric field on the tuning-fork type crystal piece 100, a driving excitation current may be applied from the outside of the unit. For this purpose, a base electrode which connects an external current source may be formed on the surface of the base unit 103. A connection electrode which connects such a base electrode to the above-mentioned grooved electrodes or side electrodes may also be formed on the base unit 103. Furthermore, a connection electrode that connects a groove electrode to a side surface electrode may also formed on the base unit 103 (not shown).

As the excitation driving current is applied from the external current to the tuning-fork type crystal piece 100 through the above described electrodes, the driving current flows to the grooved electrodes and side electrodes of arm units 101 and 102, resulting in an electric field between the electrodes. As a result, both sides of the substantially H-shaped cross section of the arm unit expands and contracts relative to one another due to piezoelectric effects, and the arm units 101 and 102 vibrate in the reverse flexural directions. Due to the flexural vibrations, the tuning-fork type crystal piece 100 may be a high Q value resonant element, wherein the Q value is the frequency selectivity (not shown).

Referring next to FIG. 7, illustrated is an exemplary electrode layout of the tuning-fork type crystal piece 100. Note that the figure shows a surface of the tuning-fork type crystal piece 100 and a depiction of the flip side is omitted to avoid redundancy.

Referring to FIG. 7, 103*e*1 and 103*e*2 are base electrodes on the surface of the base unit 103. 101*ae* is a grooved electrode on the grooved portion 101*a* of the arm unit 101 and 102*ae* is a grooved electrode on the grooved portion 102*a* of the arm unit 102. 101*be* and 102*be* are side surface electrodes on side surfaces 101*b* and 102*b* of each arm. Furthermore, side surface electrodes 101*be* and 102*be* are formed near the edge of the forks along the sides. Side surface electrodes 101*be* and 102*be* have grooved electrodes along each arm unit such that each side surface electrode is connected on both sides of each arm.

The base electrode 103*e*1 is connected to the side surface electrode 101*be* through a connection electrode 103*e*3. The base electrode 103*e*1 is also connected to a grooved electrode 102*ae* through a connection electrode 103*e*5. Similarly, the base electrode 103*e*2 is connected to the side surface electrode 102*be* through a connection electrode 103*e*4, and the base electrode 103*e*2 is connected to a grooved electrode 101*ae* through the side surface 102*be* and a connection electrode 103*e*6.

The size of the tuning-fork type crystal unit having the substantially H-shaped cross section is typically very small. For example, when the resonance frequency of a unit is 32.768 kHz, the width of the arm units 101 and 102 may be miniaturized to about 0.1 mm and width of the groove electrodes 101*a* and 102*a* may be miniaturized to about 0.07 mm. In this example, when forming the electrodes on the surface of the arm units, the installation area of electrodes may be less than 0.015 mm wide.

In general, since a width of 0.01 mm is typically needed for an electrode to maintain a good conducting state, it is possible that the space between a grooved electrode and a side surface electrode may be allowed to be up to about 0.005 mm. Consequently, due to possible errors in the manufacturing process, there may be a high probability of contacting and short-circuiting the electrodes, thus resulting in a decrease of the product yield rate during the manufacturing process. Moreover, in order to avoid the contacting and short-circuiting of the electrodes, the accuracy of the etching during the forming process of the electrodes must be improved, resulting in a more complicated process due to the miniaturization of the mask patterns and raising the cost of production.

Japanese Unexamined Patent Application No. 2002-076827, No. 2005-229143, and No. 11-160074 address such problems. Japanese Unexamined Patent Application No. 2002-076828 discloses the placement of a space between the connection electrode and the grooved electrode for a side surface electrode and/or the connection electrode for a groove electrode. Japanese Unexamined Patent Application No. 2005-229143 discloses, for example, the preventing of contact of the electrodes by gradually expanding the space between a grooved electrode and a side surface electrode with tapering at the width of the grooved electrode. Japanese Unexamined Patent Application No 11-160074 discloses a convexity division wall at the bottom of the base part of the tuning-fork shaped arm unit of a tuning-fork type crystal unit (hereinafter "fork part") to prevent contact or short circuiting of electrodes on the side surfaces on the inside of the arm unit.

In general, in order to form each electrode on the surface of the crystal unit, a metallic film may be formed on the surface of the crystal unit, for example, by vacuum based deposition or other means. Photo resist is coated on the metallic film and a photo etching process is performed to form the desired electrode pattern.

When forming an outline of a tuning-fork type crystal unit, etching is done to a space between both surfaces of the tuning-fork arms and surfaces. Because of the aeolotropy of etching, complicated formations are inverted on the fork part. When each electrode is formed on an element in such an outline formation, photo resist tends to accumulate near the bottom of the fork part due to its complicated formation, and solarization of ultraviolet during the exposure of the etching process may be insufficient due to the complicated formation. Therefore, unnecessary metallic film which should be removed during the etching process tends to remain at the fork part, and contact and short circuiting of electrode pattern can easily occur between electrodes near the fork part.

Because Japanese Unexamined Patent Applications No. 2002-076827 and No. 2005-229143 are directed to the prevention of short circuiting between electrodes by expanding the space of electrodes at a surface or a rear surface of the tuning-fork type crystal unit, the disclosures do not address an appropriate solution for the failure near the bottom of the fork part. Furthermore, Japanese Unexamined Patent Application No 11-160074 discloses a solutions to the failure near the bottom of the fork part, but special processing is needed during the outline etching process for the bottom of the fork part, resulting in a complicated manufacturing process and increased manufacturing cost.

SUMMARY OF THE INVENTION

In various embodiments, a tuning-fork type piezoelectric vibrating piece is disclosed, comprising: a base unit having a base electrode for an external connection; a fork shaped-arm unit extending from the base unit; a grooved portion at least on a surface or a rear surface of the arm unit; a grooved electrode on the grooved portion; a side surface electrode on the arm unit without the grooved portion; a first electrode connecting the base unit and the side surface electrode or the groove electrode; a second electrode connecting the grooved electrode and the side surface electrode; and a side surface electrode set at a predetermined distance from the bottom of the fork part of the base unit.

Accordingly, because the electrode on the side surface of the arm part of oscillator is isolated from a predetermined distance from the bottom of the fork part, even if metal film remains near the bottom of the fork portion due to etching defects, the remaining metal film can be prevented from short circuiting and contacting between the electrodes on the side surface and other electrodes. Therefore, a high reliable tuning-fork type piezoelectric vibrating piece is manufactured by the same previous manufacturing process and cost.

In another aspect of the present disclosure, an optimal value of the predetermined distance is one of parameters that determines a yield rate during the manufacturing process of the tuning-fork type piezoelectric vibrating piece.

The yield rate of the manufacturing process of the tuning-fork type piezoelectric vibrating piece can be correlated to the above-mentioned distance (distance from the edge of the electrode on the side surface and the bottom of the fork part). In other words, if the distance is long, the edge of electrode on the side surface and the bottom of the fork part is separated, and the possibility of short circuiting by the remaining metal film is decreased, thus increasing the yield rate. On the other hand, if the distance is short, a possibility of short circuiting by the remaining metal film is increased and the yield rate is decreased. Thus, a feature of the present disclosure the manufacture of a highly reliable tuning-fork type piezoelectric vibrating piece at a desirable manufacturing process rate.

In yet another aspect of the present disclosure, an optimal value of predetermined distance is one of the parameters that may determine an increasing rate of the equivalent series resistance value of the tuning-fork type piezoelectric vibrating piece.

There is a correlation between the equivalent series resistance value of the tuning-fork type piezoelectric vibrating piece specific and the above-mentioned distance (the distance between the edge of the side surface electrode and the bottom of the fork part). If the distance is long (i.e., the side surface electrode is short), the impression area of the excitation electric field to the arm unit becomes decreased and the equivalent series resistance value grows and causes degradation of the performance as a unit. On the other hand, if the distance is shortened (i.e., the side surface electrode is extended), the opposite situation occurs and the equivalent series resistant value is decreased and performance will be improved. Therefore, as the equivalent series resistance value of the tuning-fork type piezoelectric vibrating piece specific is maintained at less than the desired rate, a high reliable tuning-fork type piezoelectric vibrating piece can be manufactured.

In another embodiment of the present disclosure, a piezoelectric vibrating piece is formed with a crystal unit according, resulting in the manufacture of a highly reliable tuning-fork type piezoelectric vibrating piece.

In yet another embodiment, the tuning-fork type piezoelectric vibrating piece of is comprised of a ceramic unit, thus allowing for the manufacture of a high reliable tuning-fork type piezoelectric vibrating piece using a low-cost ceramic unit.

In a further embodiment, the tuning-fork type piezoelectric vibrating piece may be packaged and a base electrode of the tuning-fork type piezoelectric vibrating piece may be connected to an external output terminal outside of the package. Accordingly, such a tuning-fork type piezoelectric vibrating piece can be manufactured as an electric part which can be surface mounted to a print board of electronics, for example.

In a further embodiment, the piezoelectric oscillator may have an amplifier circuit and a feedback circuit formed between the input and output of the amplifier circuit. The feedback circuit may have a resonant element to determine the resonant frequency of the feedback loop. Accordingly, a high reliable piezoelectric oscillator can be manufactured because the piezoelectric vibrating device may be used as a device to determine the oscillating frequency of an oscillator.

According to the present disclosure, a tuning-fork type piezoelectric vibrating piece preventing the contact or short circuiting between electrodes near the bottom of the fork part, a piezoelectric vibrating device using a such unit, and a piezoelectric oscillator using such a piezoelectric vibrating device can be manufactured. Further embodiments are further described below.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The foregoing summary, as well as the following detailed description of preferred embodiments, is better understood when read in conjunction with the appended drawings. For the purposes of illustration, there is shown in the drawings exemplary embodiments; however, the present disclosure is not limited to the specific methods and instrumentalities disclosed. In the drawings.

DETAILED DESCRIPTION OF ILLUSTRATIVE EMBODIMENTS

Figure 1:
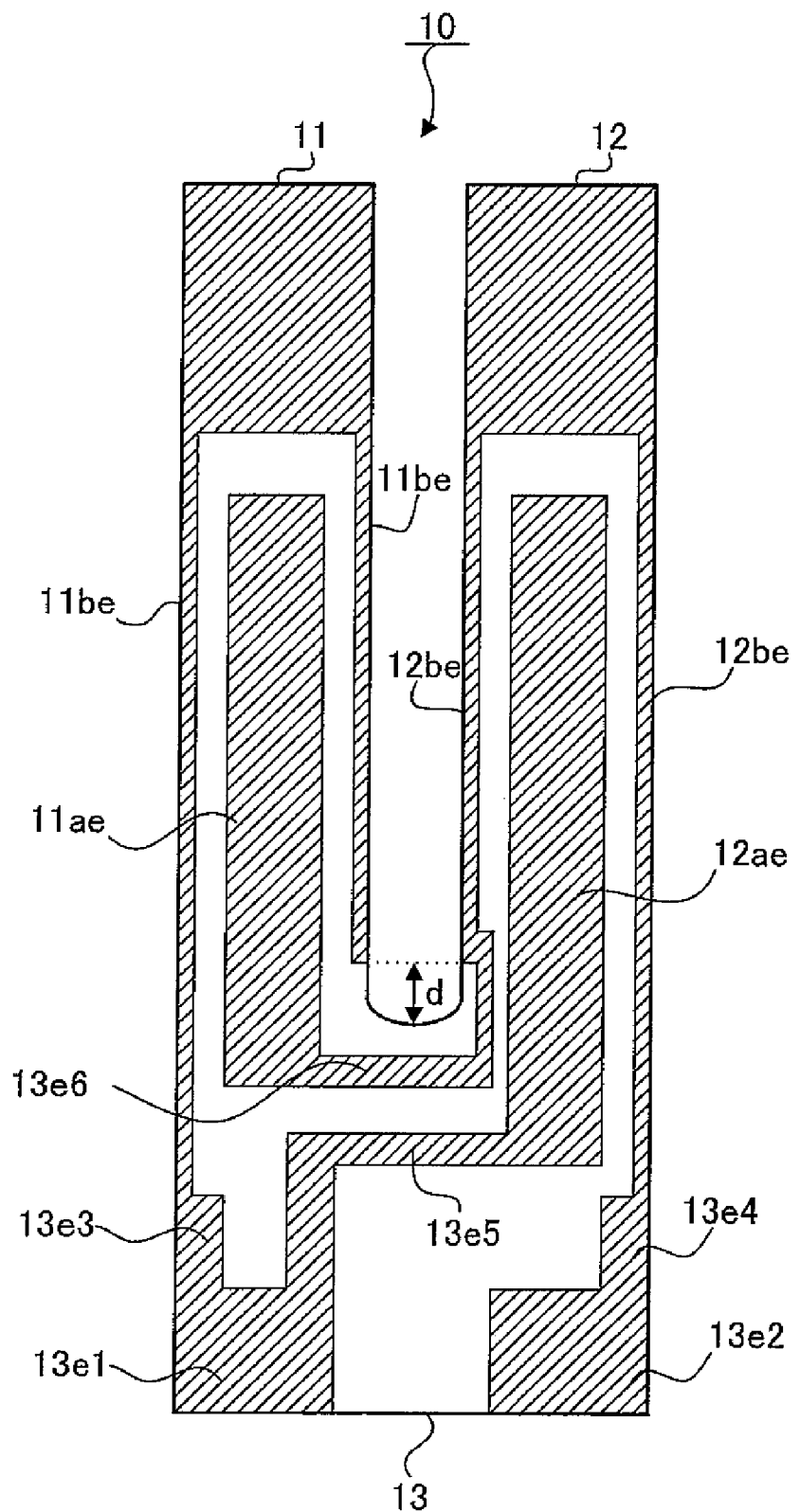
FIG. 1 shows electrode layout of a tuning-fork type piezoelectric vibrating piece in accordance with an embodiments of the present invention.

It is to be understood that the embodiments disclosed herein are not limited in application to the details of construction and the arrangement of components set forth in the following description or illustrated in the drawings. The disclosure is capable of other embodiments and of being practiced or being carried out in various ways. Also, it is to be understood that the phraseology and terminology used herein is for the purpose of description and should not be regarded as limiting.

Figure 6:
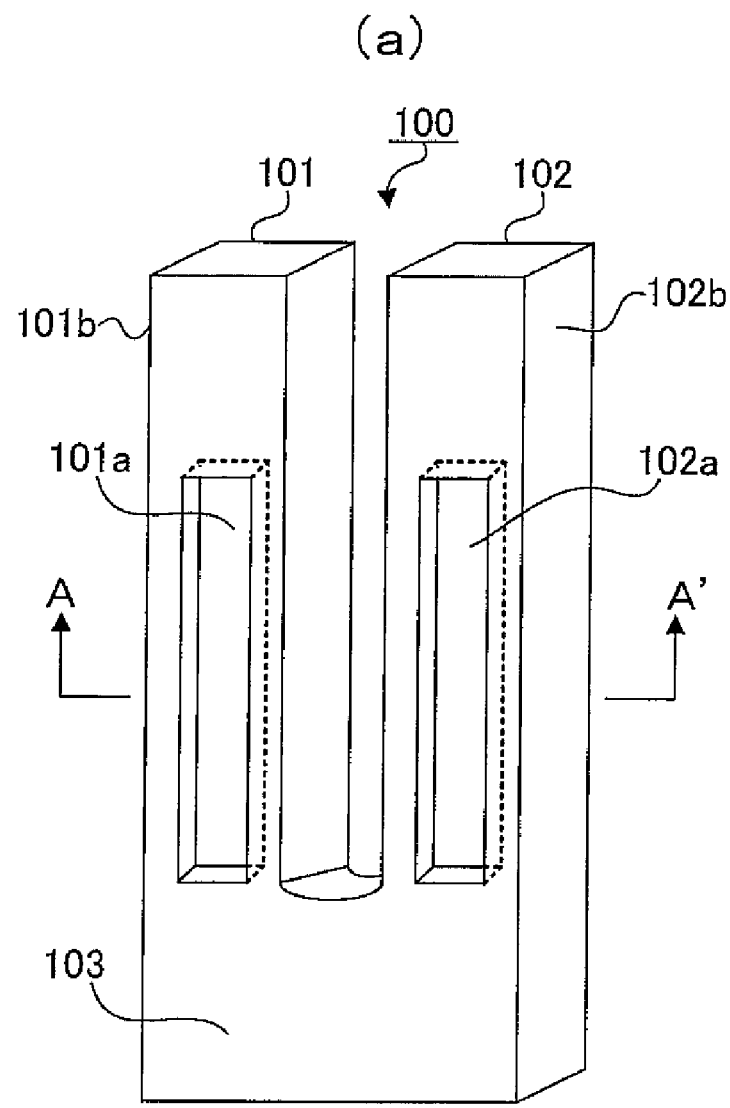
FIG. 6 shows a conventional format of the tuning-fork type crystal vibrating unit.
Figure 6:
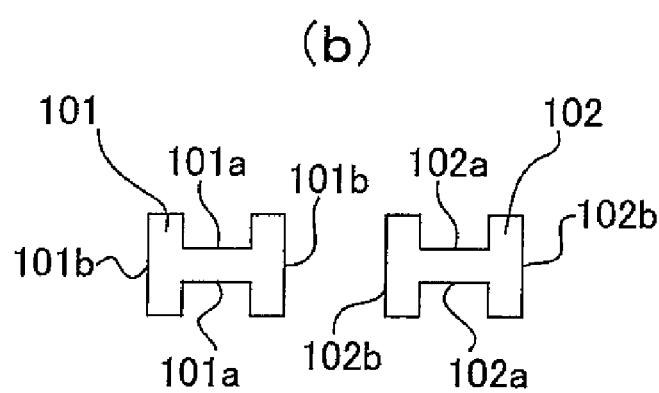
Figure 7:
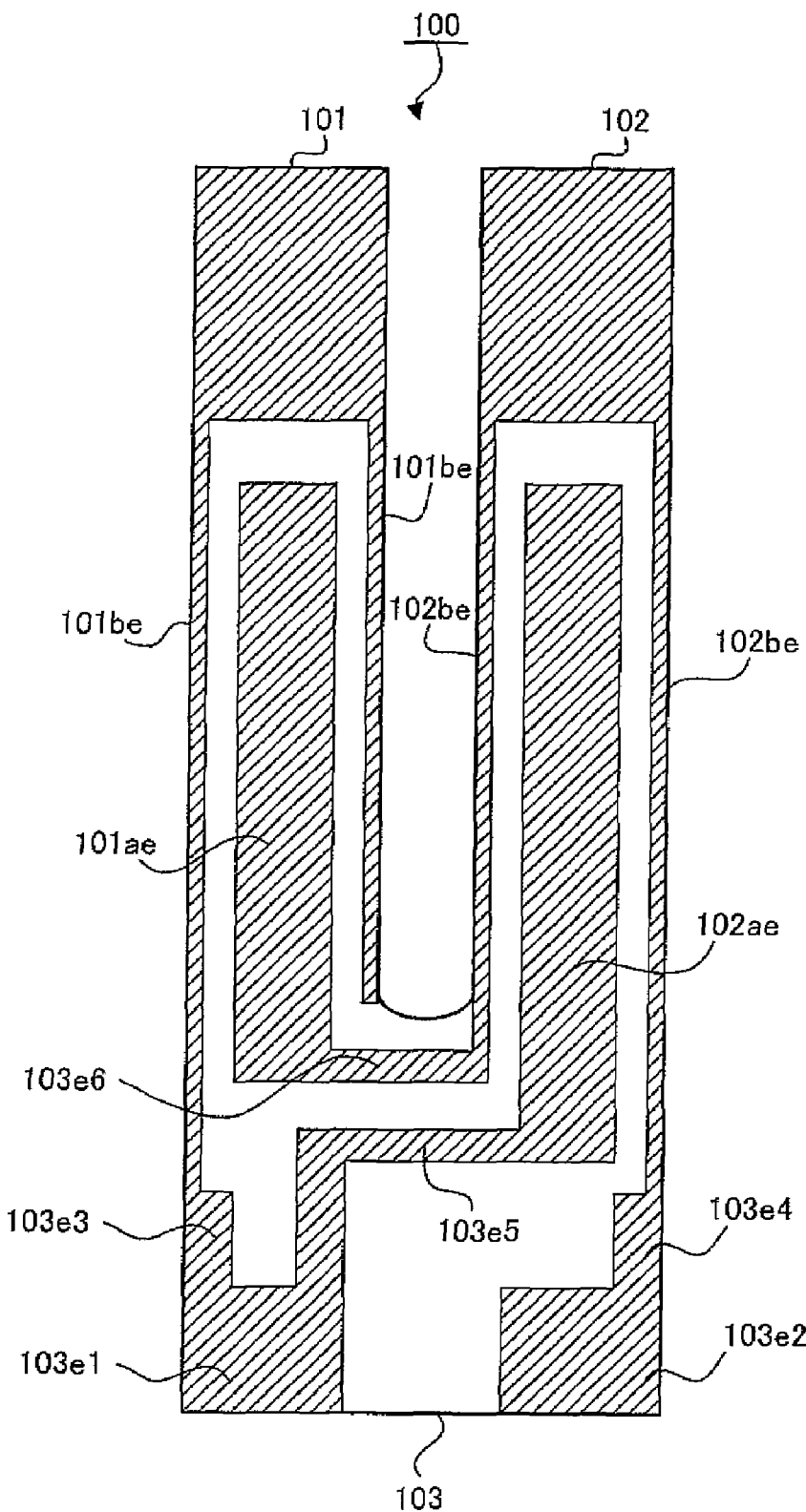
FIG. 7 shows an electrode layout of the tuning-fork type crystal vibrating unit.

In one embodiment, FIG. 1 depicts an exemplary layout of the electrodes for the excitation and connections at the tuning-fork type piezoelectric vibrating piece 10. It should be noted that the tuning-fork type piezoelectric vibrating piece 10 depicted in FIG. 1 is similar to that explained in FIG. 6 above, and the perspective view of the entire unit or the cross-sectional view of the arm unit is omitted. As shown, the tuning-fork type piezoelectric vibrating piece 10 in FIG. 1 is comprised of a base unit 13 and arm units 11 and 12 extending from the base unit.

Grooved portions 11a and 12a are formed on the top surface and rear surface of the arm units 11 and 12. Therefore, a cross-sectional figure of the arm units 11 and 12 are substantially H-shaped cross-sections as shown in FIG. 6(b). In contrast to a crystal unit, the tuning-fork type piezoelectric vibrating piece with the arm units in a substantially H-shaped cross section enables an increase in the electromechanical conversion coefficient even when the crystal vibration piece is miniaturized. Therefore, the CI value, which is one of the indices of quality, can be reduced.

Referring to FIG. 1, electrodes 13e1 and 13e2 are base electrodes on the surface of the base unit 13. Electrode 11ae is a groove electrode on the grooved portion 11a of arm unit 11ae, and electrode 12ae is a groove electrode on a grooved portion 12a of arm portion 12. Electrodes 11be and 12be are side surface electrodes on side surface portions 11b and 12b of each arm portion 12. Note that the side surface electrode is formed on both side surfaces of the arm unit (both inside and outside of the tuning-fork type arm) and near the top of the tuning-fork type piezoelectric vibrating piece at the groove portions.

Next, the relationship of the connections between each electrode is described as follows. The base electrode 13e1 is connected to a side surface electrode 11be through a connection electrode 13e3, and the base electrode 13e1 is also connected to the groove electrode 12ae through a connection electrode 13e5. Similarly, the base electrode 13e2 is connected to a side surface electrode 12be through a connection electrode 13e4, and the base electrode 13e2 is connected to a groove electrode 11ae through the side surface electrode 12be and a connection electrode 13e6.

The driving current for excitation is applied to the tuning-fork type crystal vibrating piece 10 through the base electrodes 13e1 and 13e2 from an external current source. The driving current is provided to each groove electrode of the arm units 11 and 12 through the above-described electrodes and an excitation electrical field is formed between each electrode. As a result, both side portions of a substantially H-shaped cross-section on the arm portion form expansions and contractions in opposite directions to one other due to piezoelectric effects. The arm units 11 and 12 form flexion vibrations in opposite directions to one other due. As a result, high Q value vibration units may be manufactured.

The process of forming the above-mentioned electrodes on the surface of the tuning-fork type crystal vibration piece 10 is explained as follows:

By etching an appropriate crystal board, an outline of a tuning-fork type crystal vibration piece that has no electrodes on its surface may be formed. The process of forming the electrodes of the arm portions 11 and 12 is further explained below. It should be noted that since the formation of both arms is similar, the arm portion 11 is used as an example.

Figure 2:
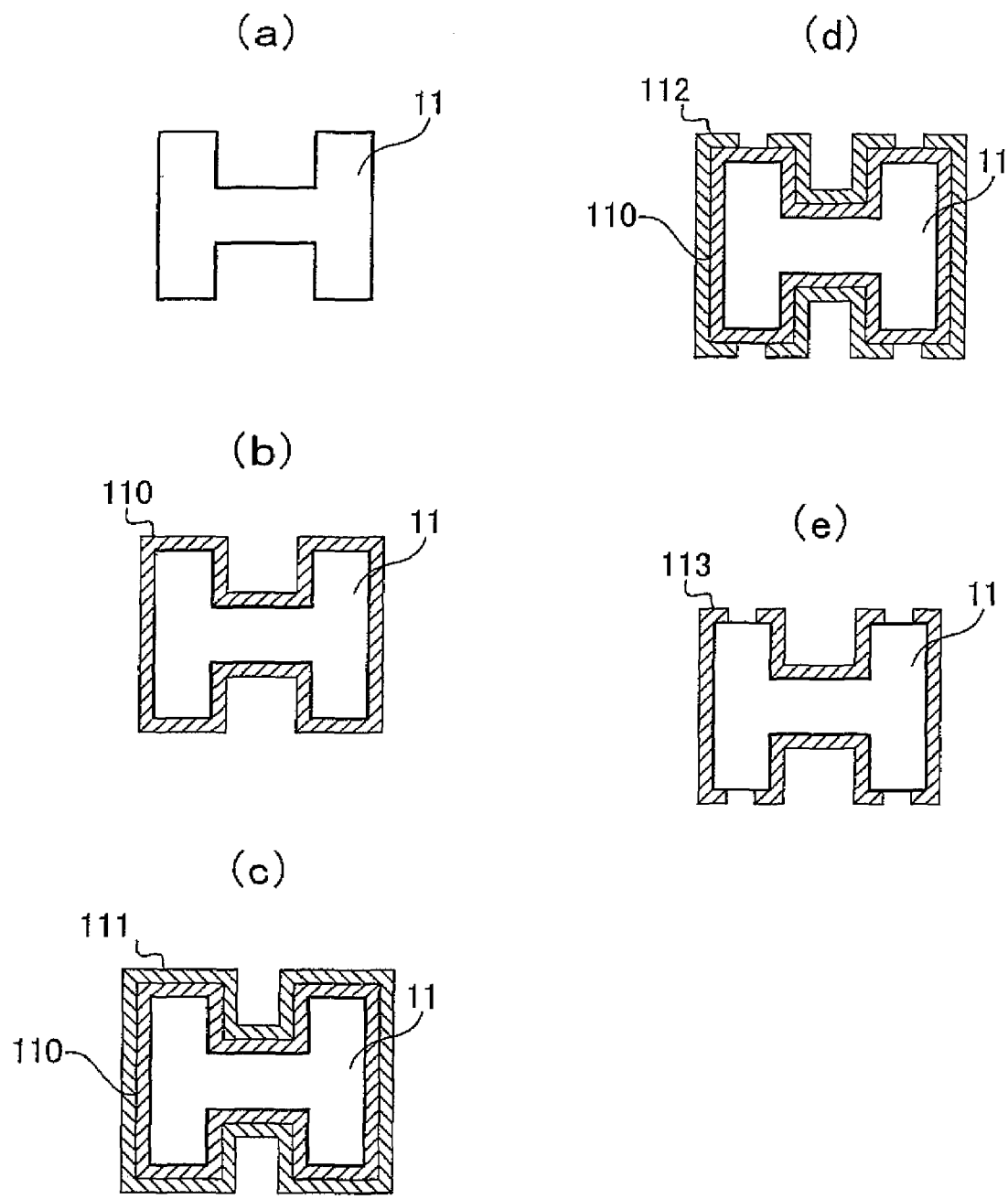
FIG. 2 shows a method of etching process on the arm unit of the tuning-fork type piezoelectric vibrating piece illustrated in FIG. 1.

FIG. 2 illustrates an exemplary process for forming each electrode on the arm portion 11. FIG. 2(a) illustrates a cross-sectional view of the arm portion 11 of a tuning-fork type crystal vibrating piece in which an outline is formed by the above-described etching process. As described above, a groove portion 11a is formed on both surfaces of the arm portion 11. A metallic film 110 using a vacuum deposition technology, for example, is formed on the entire surface of the tuning-fork type crystal vibrating piece including the arm portion 11, as depicted in FIG. 2(b).

A bottom layer of a metallic film may be formed with chrome and the thickness may be set to, for example, 100 or 1000 angstroms. The upper layer may be formed with gold and the thickness may be set to, for example, 500 or 1000 angstroms. It should be clear to those skilled in the art that the material and film thickness values used in this example only illustrates one embodiment and that the present disclosure is not limited to the example shown.

Referring now to FIG. 2(c), after forming the metal film 110 on the entire surface of the tuning-fork type crystal vibrating piece, photo resist may be coated on the entire surface and photo resist film 111 may be formed on the top of the metallic film 110. Such a photo resist may be a chemical compound comprising resin with solarization sensitive to ultraviolet. Since the photo resist may have fluidity due to microscopic particles, it is preferably sprayed as a mist. In one embodiment, the thickness of photo resist film 111 is preferably 1 micrometer to 6 micrometers.

The forming process of the photo resist pattern may be performed as a next step. First, ultraviolet may be irradiated on the photo resist film 111 through a mask pattern that covers the tuning-fork type crystal vibrating piece, thus forming part of each electrode. After the exposure process, excess photo resist that resisted in areas where the mask pattern did not cover the tuning-fork type crystal vibrating piece may be removed with a developer and the remaining photo resist film 111 may be solidified using a heat treatment process. This process forms a photo resist pattern 112 corresponding to an electrode forming portion. An etching process may then be performed by using the photo resist pattern 112 as a mask, excess metallic film removed, and a metallic film 113 of electrode portion may be formed.

In the photo etching process described above, if excess photo resist remains due to insufficient exposure of ultraviolet, the metallic film under the excess photo resist may not be removed, causing contact and/or short circuiting between electrodes.

Referring to FIG. 1, the predetermined distance d is formed between each edge of the side surface electrodes 11*be* and 12*be* inside the tuning-fork type arm portion and the bottom of the fork portion. The enlarged perspective view near the fork part depicted in FIG. 3 provides a further illustration.

Figure 3:
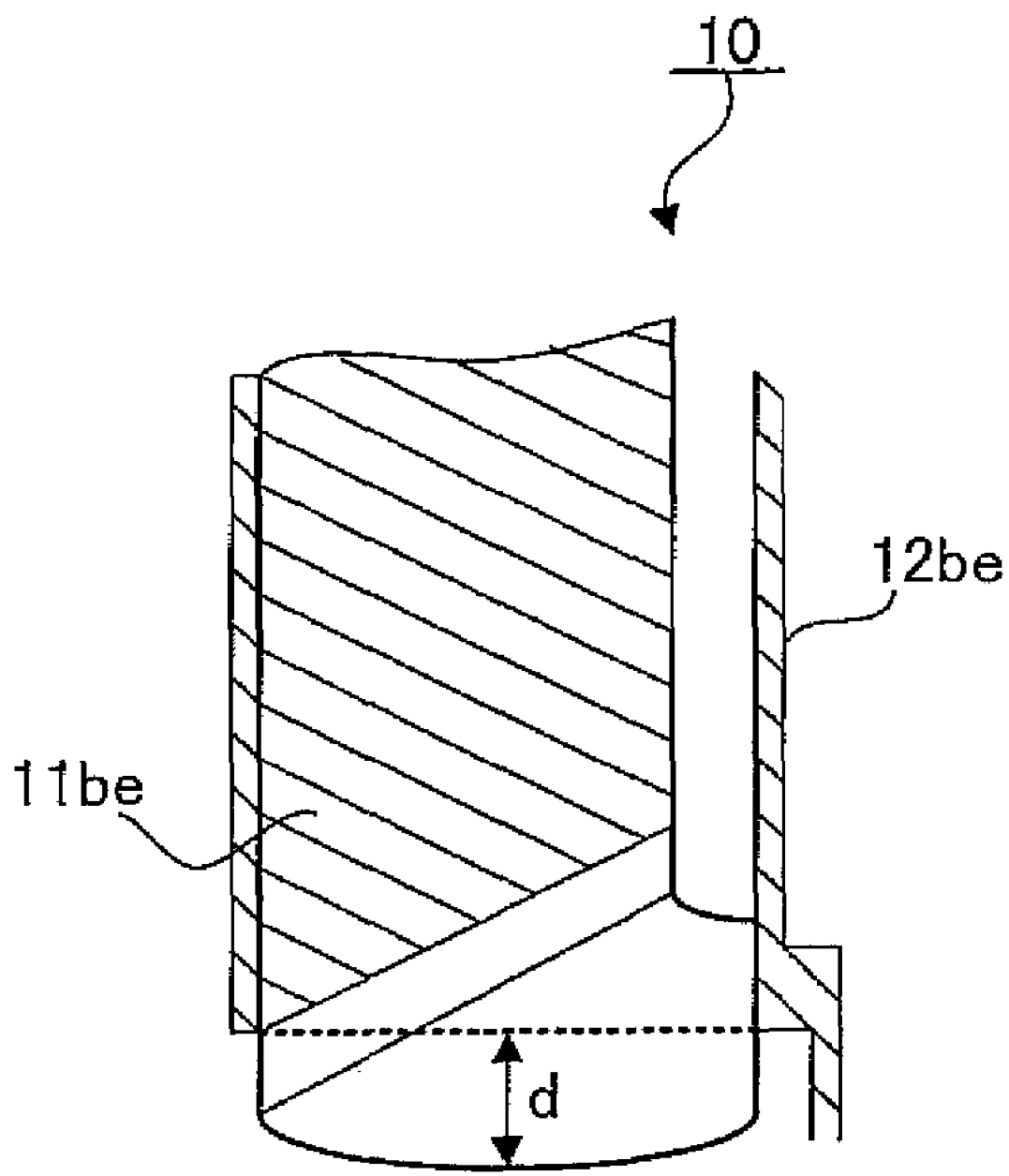
FIG. 3 shows a condition of side surface electrode setting inside of fork part of arm unit on the tuning-fork type piezoelectric vibrating piece illustrated in FIG. 1.

In the present disclosure, the formation of side surface electrodes 11*be* and 12*be* are illustrated in FIG. 3 at the tuning-fork type crystal vibrating piece 10. Each side surface electrode of the inside of the fork part is sufficiently isolated from the bottom of the fork part. As a result, any remaining metallic film may prevent contact or short circuiting between other side surface electrodes due to the insufficient exposure of the photo resist pattern during the forming process, even if excess metallic film remains at the bottom of the fork part.

When the distance d is expanded, i.e., the edge of the side surface electrode from the bottom of fork part is isolated, the possibility of contact or short circuiting between electrodes is decreased so that the yield rate of the products will be increased. However, when the distance d is expanded, the electrode area of the side surface electrode is decreased, causing a decrease of the impressed excitation electrical field at the arm unit and thus lowering the quality of the tuning-fork type crystal vibrating piece. The decrease of quality may manifest, for example, as an increase of the equivalent inline resistance value of the tuning-fork type crystal vibrating piece.

Therefore, a non-optimal distance d may be used if the decrease of the product yield rate or an increased equivalent inline resistance value can be varied to determine a best overall approach. In other words, if the manufacture of a reliable tuning-fork type crystal unit with a low CI value is desired, the distance d can be set shorter if the decrease of the product yield rate is acceptable. On the other hand, if a high product yield rate is desired, the distance d can be set longer if the increase of the CI value is acceptable.

In various embodiments, a crystal vibrating piece may be used as a member of a tuning-fork type crystal vibrating piece. However, the present disclosure is not limited to such cases. For example, a ceramic unit or other piezoelectric unit can be used to comprise the tuning-fork type crystal vibrating piece disclosed herein.

Figure 4:
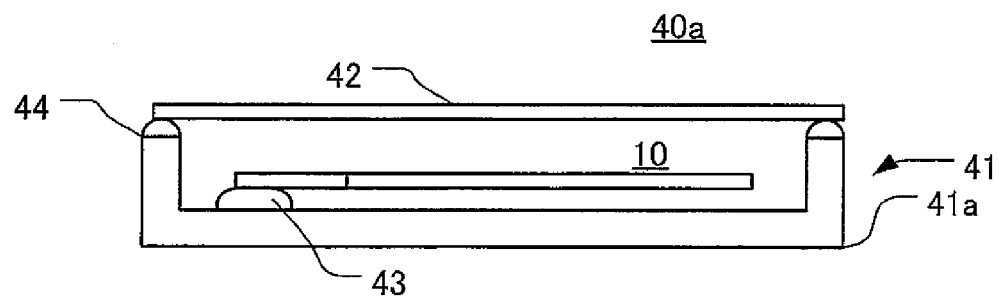
FIG. 4 shows an outline of the format of piezoelectric vibrating device by each embodiment in accordance with an embodiment of the present invention.
Figure 4:
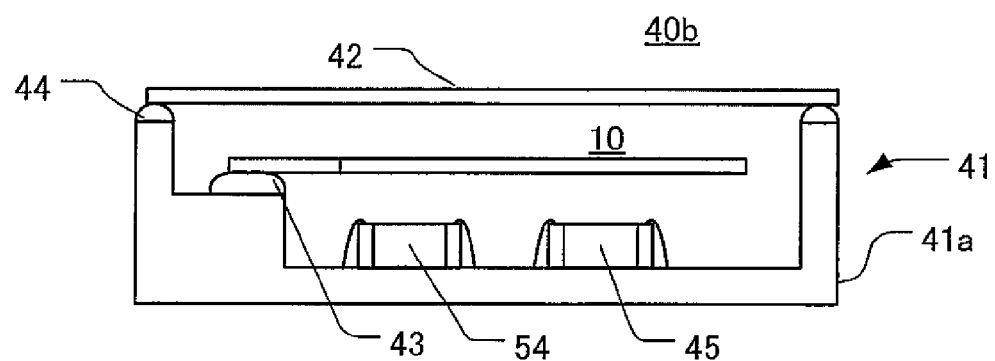
Figure 4:
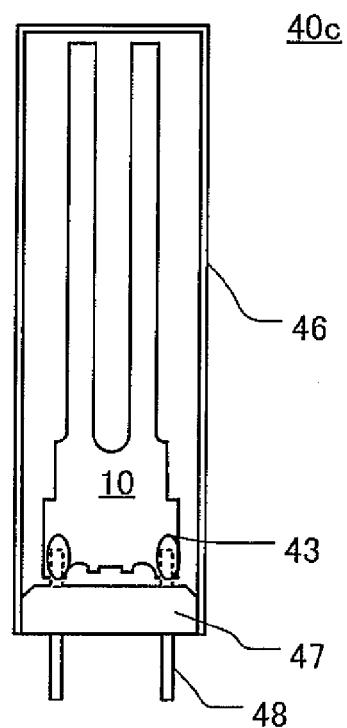

Turning now to FIG. 4, illustrated is a view of a cross-sectional frame format of a piezoelectric device in accordance with another embodiment of the present disclosure. FIG. 4(*a*) is a cross sectional view illustrating the format of a piezoelectric device comprised of a ceramic package 40*a* in accordance with the embodiment described above. A ceramic package 41 of piezoelectric device 40*a* is comprised of a base portion 41*a* and an overhead cover 42, and a tuning-fork type crystal vibrating unit 10 as disclosed herein may be built in. The tuning-fork type crystal vibrating piece 10 is connected electrically to the base portion 41*a* through a bonding portion 43 and mechanically supported by the base portion 41*a*. Finally, the base portion 41*a* and the overhead cover 42 of the ceramic package 41 is sealed and stopped by seal 44.

Referring now to FIG. 4(*b*), illustrated is a cross-sectional format view of a piezoelectric device accordance with one embodiment. This piezoelectric device 40*a* may be similar to the format of the above-described piezoelectric device comprised of ceramic package 40*a*. Accordingly, a description of the format and function of piezoelectric device 40*a* and the tuning-fork type crystal vibrating piece 10 may be omitted with reference to the corresponding figure labels as shown.

The piezoelectric device 40*b* illustrated in FIG. 4(*b*) may have a plurality of integrated circuits 45 on top of the base portion 41*a* placed at a bottom of the tuning-fork type crystal vibrating piece 10, wherein the piezoelectric device is comprised of a ceramic package 40*a* as illustrated in FIG. 4(*a*). In other words, an output signal from the tuning-fork type crystal vibrating piece 10 placed in the piezoelectric device 40*a* is provided to the integrated circuit 45 once. The output signal is then output as a frequency signal from the piezoelectric device 40*b* after various processes are performed at the integrated circuit 45.

The integrated circuit 45, for example, can be a frequency dividing circuit, PLL (Phase Locked Loop), or a temperature compensating circuit comprising a thermometer. Note that the numbers and shapes of the integrated circuit 45 illustrated in FIG. 4(*b*) is provided merely for exemplary purposes and the embodiment is not limited to the examples shown.

In yet another embodiment, FIG. 4(*c*) illustrates a format of a cylinder type piezoelectric device 40*c*. The piezoelectric device 40*c* contains the above-mentioned tuning-fork type crystal vibrating piece 10 inside, for example, a metallic cap (cylinder) portion 46. A stem 47 is pushed into an open end of the cap 46 in order to keep the inside of the cap 46 in a vacuum state.

In order to keep the tuning-fork type crystal vibrating piece 10 contained inside of the cap 46 and to connect it electrically, a pair of external output terminals 48 may be formed and penetrates the stem 47. Each external output terminal 48 is connected to the base electrodes 13*e*1 and 13*e*2 of the tuning-fork type crystal vibrating piece 10. Driving current from an external current source through the external output terminal 48 and the base electrodes 13*e*1 and 13*e*2 are applied to the tuning-fork type crystal vibrating piece 10, which may then be excited to the characteristic frequency.

The piezoelectric vibrating device as described above, further comprising a tuning-fork type crystal vibrating piece 10 may provide the feature of a frequency-stable and highly reliable piezoelectric vibrating device.

Figure 5:
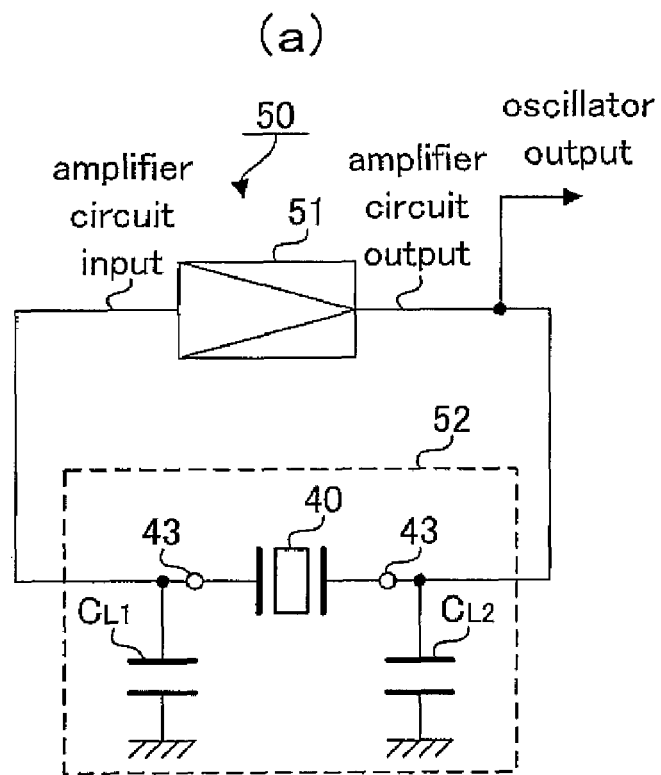
FIG. 5 shows a circuit format block of a piezoelectric oscillator in accordance with an embodiment of present invention.
Figure 5:
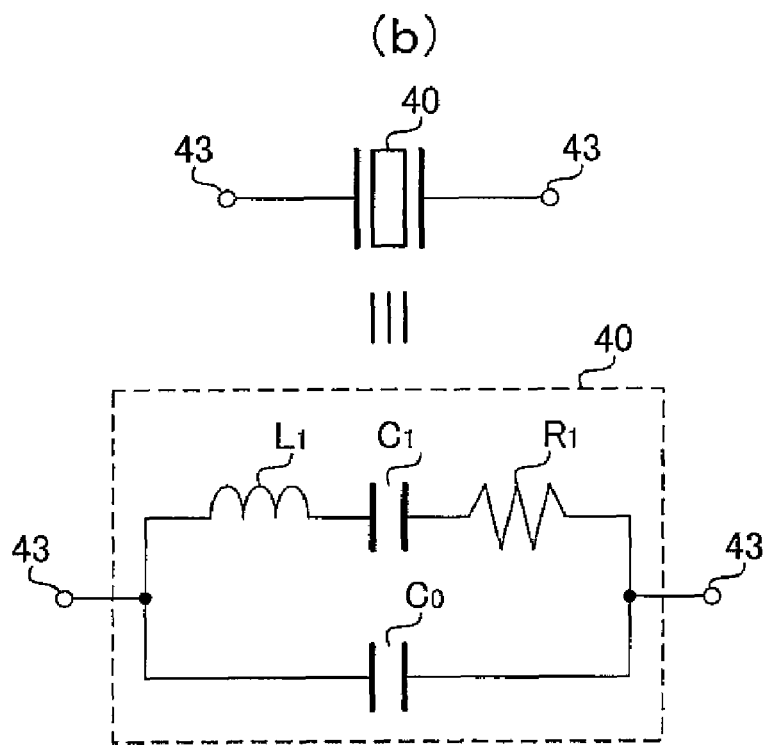

In yet another embodiment of the present disclosure, FIG. 5(*a*) depicts a circuit block diagram illustrating a format of a piezoelectric oscillator 50 as described above. An amplifier circuit 51 may, for example, be comprised of active amplifier elements such as a transistor, an operational amplifier, or inverter. A feedback circuit 52 may be a feedback circuit to transmit the output of the amplifier circuit 51 to an input and may generally be comprised of a circuit network having a resonant element determining an oscillating frequency of an oscillator in the circuit loop. A feedback circuit 52 may use an embodiment of a piezoelectric vibrating device 40 disclosed above as such a resonant element.

Note that the piezoelectric oscillator 50 illustrated in FIG. 5(*a*) forms a Colpitt oscillating circuit which divides the output of the amplifier circuit by two capacitors $C_{L1}$ and $C_{L2}$ and transmits the output back to the input side of amplifier circuit. However, the circuit format of piezoelectric oscillator illustrated in FIG. 5(*a*) depicts one embodiment. The circuit format of the oscillator is not limited to such an oscillating circuit.

The oscillating frequency of the piezoelectric oscillator 50 is analogous to the circuit of the piezoelectric vibrating device 40 as illustrated in FIG. 5(*b*). In the figure, $C_0$ is a parallel capacitor of the piezoelectric vibrating device 40, $L_1$ is its equivalent series inductor, $C_1$ is its equivalent series capacitor, and R1 is its equivalent series resistance.

If the series resonant frequency of the piezoelectric vibrating device 40, (i.e., the smallest frequency of which the impedance between the two edges of the piezoelectric vibrating device 40 is $f_r$), the series resonant frequency $f_r$ is as indicated below:

$$f_r = \frac{1}{2\pi\sqrt{L_1 C_1}}$$

Similarly, in the circuit depicted in FIG. 5(*a*), if the compound values of $C_{L1}$ and $C_{L2}$ are set as $C_L$, the result will be $C_L = C_{L1} \times C_{L2}/(C_{L1} C_{L2})$. Therefore, the oscillation frequency $f_0$ of piezoelectric oscillator 50 as well as the oscillation frequency in the Colpitts oscillation circuit can be set up as follows:

$$f_0 = f_r \sqrt{1 + \frac{C_1}{C_0 + C_L}}$$

In general, since the equivalent series capacitor $C_1$ of piezoelectric vibrating device 40 is one digit smaller than other capacitance values of capacitor $C_0$ and $C_L$, the piezoelectric oscillator 50 oscillates at a higher frequency $f_0$ than series resonant frequency $f_r$. To adjust the value of load capacitor $C_{L1}$ and $C_{L2}$, it may be possible to fine adjust the value of oscillation frequency $f_0$.

The piezoelectric oscillator of the third embodiment of this invention may be used in conjunction with the piezoelectric vibrating device disclosed above that may be a resonant device setting an oscillating frequency in the feedback path. This enables the manufacture of a high quality, highly reliable piezoelectric oscillator that is stable in oscillating frequency.

While the present disclosure has been described in connection with the preferred aspects, as illustrated in the various figures, it is understood that other similar aspects may be used or modifications and additions may be made to the described aspects for performing the same function of the present disclosure without deviating there from. For example, in various aspects of the disclosure, the tuning-fork type vibrating piece, piezoelectric vibrating device, and piezoelectric oscillator were disclosed. The various embodiments disclosed herein may be used with various kinds of devices, such as a communication device or a control device using piezoelectric oscillators as a supply source of a high-precision frequency signal. However, other equivalent mechanisms to these described aspects are also contemplated by the teachings herein. Therefore, the present disclosure should not be limited to any single aspect, but rather construed in breadth and scope in accordance with the appended claims.

What is claimed:

1. A tuning-fork type piezoelectric vibrating piece comprising:
    a base unit comprising a base electrode;
    a fork shaped-arm unit coupled to the base unit;
    a groove portion on at least one of: a surface or a rear surface of an arm unit;
    a groove electrode on the groove portion;
    a side surface electrode on the arm unit without the groove portion;
    a first electrode connecting the base electrode and at least one of the side surface electrode or the groove electrode; and
    a second electrode connecting the groove electrode and the side surface electrode;
    wherein the side surface electrode is set at a predetermined distance from the bottom of a fork part of the base unit.

2. The tuning-fork type piezoelectric vibrating piece according to claim 1, wherein said predetermined distance is determined as a function of a product yield rate of the tuning-fork type piezoelectric vibrating piece.

3. The tuning-fork type piezoelectric vibrating piece according to claim 1, wherein said predetermined distance is determined as a function of an increasing rate of an equivalent series resistance value of the tuning-fork type piezoelectric vibrating piece.

4. The tuning-fork type piezoelectric vibrating piece according to claim 1, further comprising a crystal piezoelectric unit.

5. The tuning-fork type piezoelectric vibrating according to claim 1, further comprising a ceramic piezoelectric unit.

6. A piezoelectric vibration device comprising:
    a tuning-fork type piezoelectric vibrating piece packaged in an enclosure, wherein said tuning-fork type piezoelectric vibrating piece comprises:
        a base unit comprising a base electrode;
        a fork shaped-arm unit coupled to the base unit;
        a groove portion on at least one of: a surface or a rear surface of an arm unit;
        a groove electrode on the groove portion;
        a side surface electrode on the arm unit without the groove portion;
        a first electrode connecting the base electrode and at least one of the side surface electrode or the groove electrode; and
        a second electrode connecting the groove electrode and the side surface electrode;
        wherein the side surface electrode is set at a predetermined distance from the bottom of a fork part of the base unit; and
    a base electrode coupled to the tuning-fork type piezoelectric vibrating piece, wherein the base electrode is connected to an external terminal of said enclosure.

7. A piezoelectric oscillator comprising:
    an amplifier circuit comprising a feedback circuit formed between an input and output of the amplifier circuit; said feedback circuit comprising a piezoelectric vibrating device as a resonant element to determine a resonant frequency of a feedback loop, said piezoelectric vibrating device comprising:
    a tuning-fork type piezoelectric vibrating piece packaged in an enclosure, wherein said tuning-fork type piezoelectric vibrating piece comprises:
        a base unit comprising a base electrode;
        a fork shaped-arm unit coupled to the base unit;
        a groove portion on at least one of: a surface or a rear surface of an arm unit;

a groove electrode on the groove portion;
a side surface electrode on the arm unit without the groove portion;
a first electrode connecting the base electrode and at least one of the side surface electrode or the groove electrode; and
a second electrode connecting the groove electrode and the side surface electrode;
wherein the side surface electrode is set at a predetermined distance from the bottom of a fork part of the base unit; and
a base electrode coupled to the tuning-fork type piezoelectric vibrating piece, wherein the base electrode is connected to an external terminal of said enclosure.

* * * * *